United States Patent [19]
Cuthbert et al.

[11] 3,737,897
[45] June 5, 1973

[54] ANALOG TO DIGITAL CONVERTER

[75] Inventors: Laurence Geoffrey Cuthbert, Harlow; Raymond John Anderson, Boreham Wood, both of England

[73] Assignee: International Standard Electric Corporation, New York, N.Y.

[22] Filed: Dec. 29, 1971

[21] Appl. No.: 213,617

[30] Foreign Application Priority Data

Jan. 25, 1971 Great Britain........................3,086/71

[52] U.S. Cl.............................340/347 AD, 324/99 D
[51] Int. Cl...............................................H03k 13/20
[58] Field of Search.......................340/347; 324/99 D

[56] References Cited

UNITED STATES PATENTS

| | | | |
|---|---|---|---|
| 3,111,662 | 11/1963 | Pierce | 340/347 |
| 3,505,668 | 4/1970 | Ottesen | 340/347 |

*Primary Examiner*—Charles D. Miller
*Attorney*—C. Cornell Remsen, Jr., Walter J. Baum, Philip M. Balton et al.

[57] ABSTRACT

An analog to digital converter is disclosed having a reference signal in the form of a ramp waveform starting at a given negative potential and increasing to a given positive potential through ground or zero potential. Two amplitude comparators are provided, the first comparator producing a first output signal when the amplitude of the analog signal equals the amplitude of the ramp waveform and the second comparator producing a second output signal when the amplitude of the ramp waveform equals zero or ground potential. A counting and arithmetic arrangement responds to the first and second output signals to provide a digital output signal representative of the amplitude difference between ground potential and the amplitude of the analog signal. A polarity detector is coupled to the output of the first and second detectors and in response to the first and second output signals provide a digital bit representing the polarity of the analog signal. A storage device combines the digital output signal from the counting and arithmetic arrangement and the digital bit from the polarity detector to provide the digital output signal for the converter. Three embodiments of the counting and arithmetic arrangement are disclosed.

5 Claims, 6 Drawing Figures

ANALOG TO DIGITAL CONVERTER

BACKGROUND OF THE INVENTION

This invention relates to analog to digital converters.

One of the standard techniques for performing analog to digital conversion is to produce a ramp waveform, usually by integration of a reference signal, and to compare the amplitude of the ramp waveform with the amplitude of the analog signal. When the signals being compared are equal the amplitude comparator gives an output, so that a measure is derived of the time between the start of the ramp and the comparator output. This time is proportional to the signal amplitude and is used to produce an appropriate digital signal, e.g. from a counter started with the ramp and stopped when the comparator gives its output.

Such a technique can lead to difficulty when handling analog signals which can be either positive or negative.

SUMMARY OF THE INVENTION

Therefore, an object of the present invention is to provide an analog to digital converter in which the difficulty in employing the above-mentioned prior art technique is at least minimized.

A feature of the present invention is the provision of an analog to digital converter comprising a first source of reference signal in the form of a ramp waveform starting at a given negative potential and increasing to a given positive potential through zero or ground potential; a second source of input analog signal; a first amplitude comparator coupled to the first and second sources providing a first output signal when the amplitude of the analog signal and the amplitude of the reference signal are equal; a second amplitude comparator coupled to the first source and ground potential providing a second output signal when the amplitude of the reference signal equals ground potential; first means coupled to the first and second comparators responsive to the first and second output signals to provide a first digital output signal representative of the amplitude difference between ground potential and the amplitude of the analog signal; second means coupled to the first and second comparators responsive to the first and second output signals to provide a second digital output signal indicating the polarity of the analog signal; and third means coupled to the first and second means to combine the first and second digital output signals and thereby provide a digital output signal for the converter.

BRIEF DESCRIPTION OF THE DRAWING

Above-mentioned and other features and objects of this invention will become more apparent by reference to the following description taken in conjunction with the accompanying drawing in which.

DESCRIPTION OF THE PREFERRED EMBODIMENTS

Figure 1:
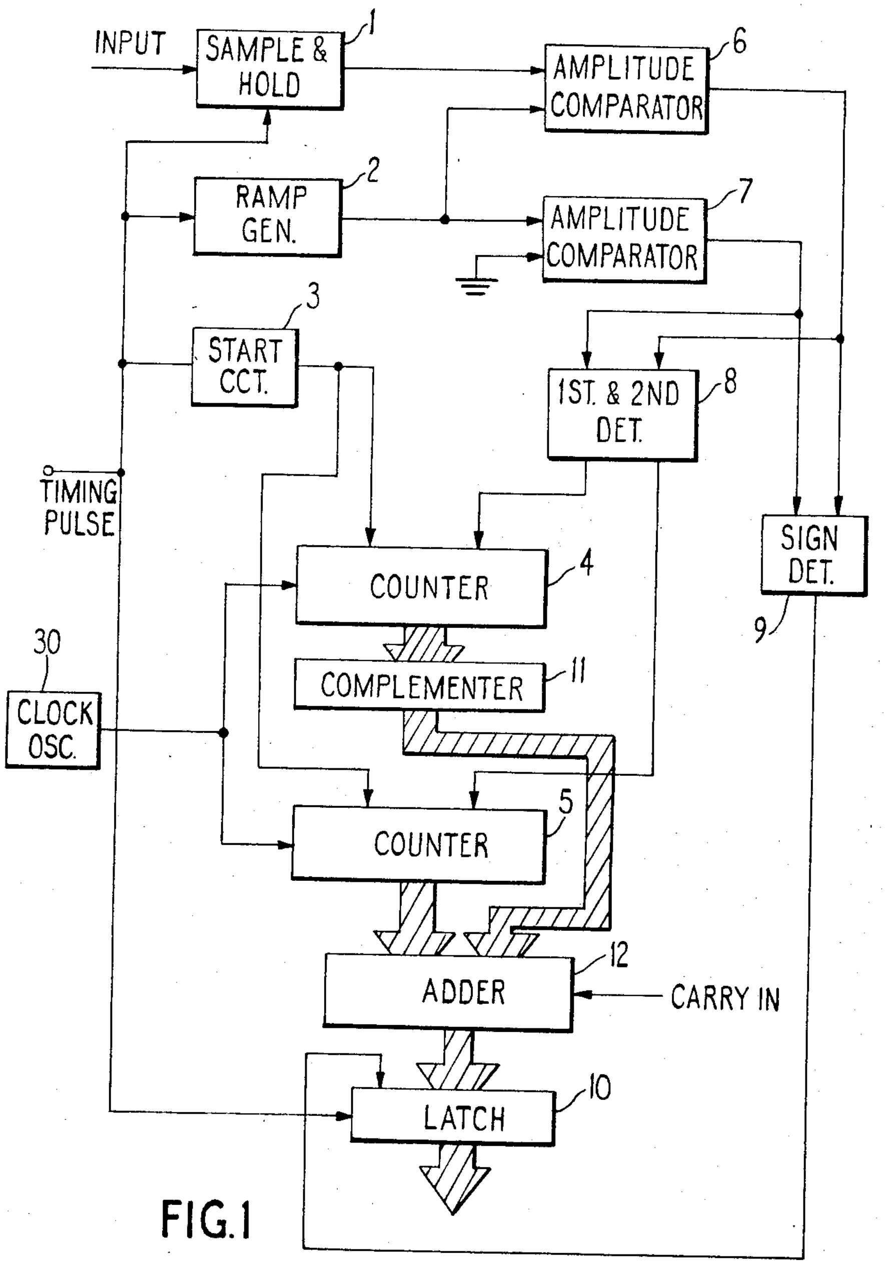
FIG. 1 is a schematic block diagram of a first embodiment in accordance with the principles of the present invention.

The circuit shown in FIG. 1 is largely made up from standard commercially available integrated circuits units and for this reason separate schematic diagrams are not illustrated for most of the blocks.

The analog signal to be converted to a digital signal is applied via the input to a sample and hold circuit 1. When a sample is to be "digitized" a timing pulse is applied to circuit 1 to cause a capacitor included therein to be charged to a voltage level proportional to the signal amplitude. In addition, a ramp generator 2 is reset by the timing pulse to its base line level: this is a below-ground level, for instance −5 volts. Generator 2 now commences to operate to produce a ramp waveform which rises linearly. Finally the timing pulse actuates a start circuit 3, whose output signal is coupled to the two binary counters 4 and 5 to enable them. Hence, counters 4 and 5 both step or count in response to pulses from a clock oscillator 30.

The analog signal amplitude, as stored on the capacitor in sample and hold circuit 1, is applied to one input of a first amplitude comparator 6. The ramp waveform from generator 2 is applied to the other input of comparator 6. The ramp waveform is also applied to one input of a second amplitude comparator 7, whose other input is grounded. These comparators 6 and 7 are basically long-tailed pair devices. Thus, comparator 6 provides an output signal when the analog signal amplitude equals the amplitude of the ramp waveform. Dependent upon the sign or polarity of the analog signal, the output signal from comparator 6 will occur either before or after the ramp waveform crosses the zero or ground potential. When the ramp waveform cross ground potential, comparator 7 provides an output signal.

Both output signals from comparators 6 and 7 are applied to a first-second detector 8, which produces an output signal in response to the first of the two comparator output signals produced to stop counter 4 and another output signal in response to the second of the two comparator output signals produce to stop counter 5. Thus, the settings or count of the two counters correspond to the time at which the ramp waveform crosses ground potential and the time at which the analog signal amplitude equals the ramp waveform amplitude. If the analog signal is negative, the count in counter 4 corresponds to the analog signal amplitude, while if the analog signal is positive the counter in counter 5 corresponds to the analog signal amplitude.

The output signals of the two comparators are also applied to a sign determining circuit or polarity detector 9, which provides a binary "1" output signal if the analog signal is negative, as indicated by comparator 6 responding before comparator 7, or a binary "0" output signal if the two comparators respond simultaneously or comparator 7 responds first. This sign or polarity output signal is applied to a latch 10, this being a standard integrated circuit unit consisting of a multistage buffer store, such as a plurality of bistable or flip flop stages. The sign output signal is recorded or stored in the left hand stage of latch 10. Note that latch 10 is initially reset to its zero state by the timing pulse.

It is now necessary to determine the value of the analog signal, and it will be seen that this can easily be effected by subtracting the smaller of the two numbers represented by the settings or counts of counters 4 and 5 from the larger of the two numbers. Now due to the operation of the first-second detector 8, the smaller number is in counter 4 and this number is complemented by a "1"s complementer 11. Complementer 11 merely replaces "1"s in the count of counter 4 by "0" and vice versa. Then the complemented version of the count of counter 4 is applied to an adder 12 to which is also applied the true count of counter 5. An additional "1" is inserted into adder 12, as shown at the right hand end of adder 1, to provide the end round carry needed in such a method of subtraction. After this operation, the setting or count or adder 12 is the true arithmetic value of the analog signal amplitude, whether the analog signal is positive or negative. It should be noted that if a suitable subtractor is available it could be used in preference to the above described method in which the minuend is complemented and added to the subtrahend.

The setting or count of adder 12 is now applied to latch 10, which, therefore, contains the arithmetic value of the analog signal amplitude and a sign or polarity indication digit. The contents of latch 10 are now available over the outputs thereof.

Figure 2:
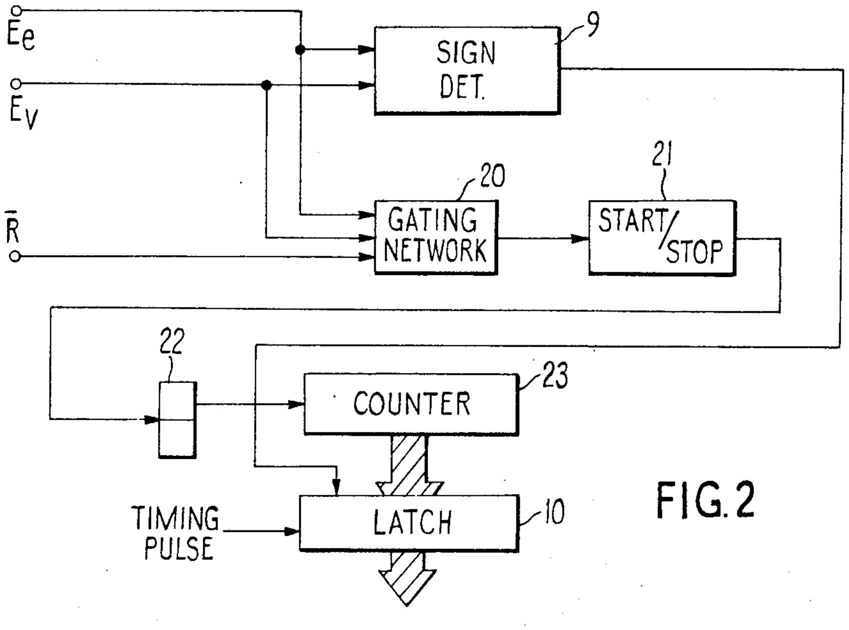
FIG. 2 is a partial schematic block diagram of the somewhat simpler second embodiment in accordance with the principles of the present invention.

A simplification, as compared with the system of FIG. 1 described above, is possible which dispenses with one of the counters, the complementer and the adder. This will be described with reference to FIG. 2. This arrangement depends on the fact that the digital value finally present in latch 10 represents the difference between two durations, each commencing with the timing pulse and ending with one of the comparator output signals. Hence, in the simplified circuit, although the timing pulse is used to initially reset the counter, a gating network is provided which responds to the two output signals of the two comparators to produce a counter start signal in response to the first of the two output signals to occur and a counter stop signal in response to the second of the two output signals to occur.

The two input signals $E_e$ and $E_v$ coupled to sign determination circuit or polarity detector 9 represent the output signals of comparators 7 and 6, respectively. The sign determination and the insertion of the sign digit into the latch 10 occur in the same manner as in the arrangement of FIG. 1. However, the comparator output signals $E_e$ and $E_v$ are also applied to two of the inputs of a gating network 20, which has coupled to a third input $\bar{R}$, i.e. the complement of the resetting pulse, this being identified in FIG. 1 as the timing pulse. The gating network is arranged to give a first output signal when, after a reset pulse occurs, either $E_e$ or $E_v$ occur and to give a second output when this is followed by $E_v$ or $E_e$. To do this, network 20 is assembled in well known manner from standard gates to perform the logic function:

$$f = \bar{R}\,E_e\,\bar{E}_v + \bar{R}\,\bar{E}_e\,E_v.$$

The output signal of the network 20 is applied to a start-stop circuit 21 which in turn feeds a fast J-K bistable 22 which controls the single counter 23. During a conversion operation, when the first output signal from network 20 occurs, start-stop circuit 21 switches bistable 22 to a "start counter" state, while when the second output signal from network 20 occurs, bistable 22 is set to its "stop counter" state. The counter setting or count now appears in latch 10, and, with the sign digit provides the analog to digital convertor output signal.

Figure 3:
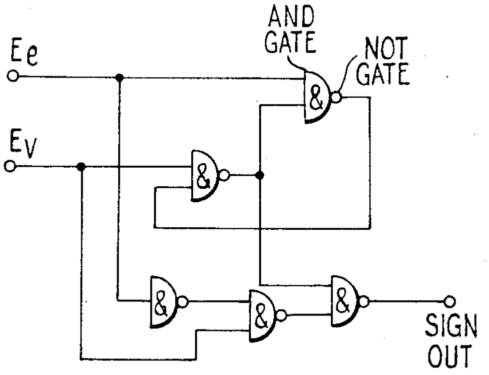
FIGS. 3, 4 and 5 illustrate in more detail the circuitry used in certain of the blocks of the arrangements of FIGS. 1 and 2.
Figure 3A:
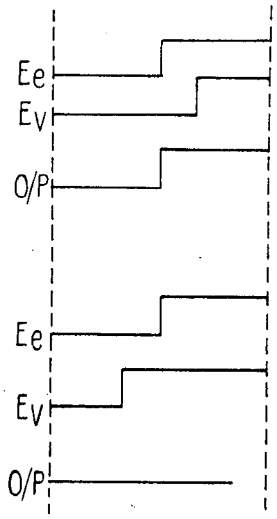

FIG. 3 illustrates one form of gate arrangement that may be used to produce the sign digit in detector 9, with explanatory waveforms illustrated in FIG. 3a. Hence, the upper set of waveforms relate to the case in which the analog signal is positive, i.e. the ground potential comparator responds first, while the lower set of waveforms relate to the case in which the analog signal is negative, i.e. the signal comparator responds first.

Certain of the blocks shown in the earlier figures which are not mere assemblies of standard units will now be briefly described.

Figure 4:
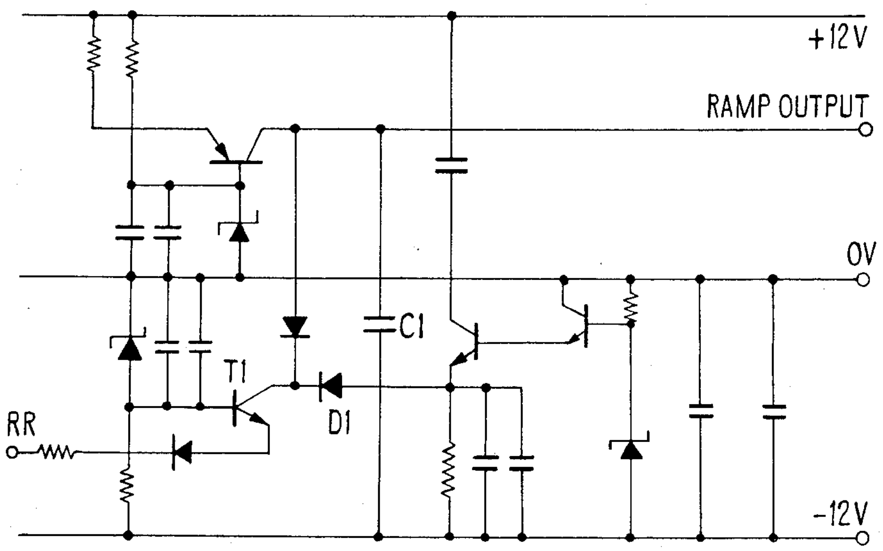

FIG. 4 illustrates the ramp generator. This circuit has, in addition to a zero or ground potential "rail" or bus, positive and negative 12 volt "rails" or buses. When a conversion is to be effected, a negative pulse on the RR (ramp reset) input is applied via a resistor and a diode to the emitter of a transistor T1. This renders T1 conductive to discharge the ramp capacitor C1. However, although its negative "rail" is at −12 volts, the voltage on C1 only falls to −5 volts due to the diode clamp provided by D1. After the resetting, capacitor C1 charges from −5 volts to +5 volts in a 16 microsecond period, the voltage on C1 remaining constant for a few microseconds to complete a 20 microsecond sampling period. This extra few microseconds allows time for subsequent circuit operations.

Although in this circuit some difficulty may be experienced due to maintaining the negative base of the ramp accurately at −5 volts, this is of no great significance because the digital output depends, in both arrangements described above with respect to FIGS. 1 and 2, on the difference between two points on the ramp waveform.

Figure 5:
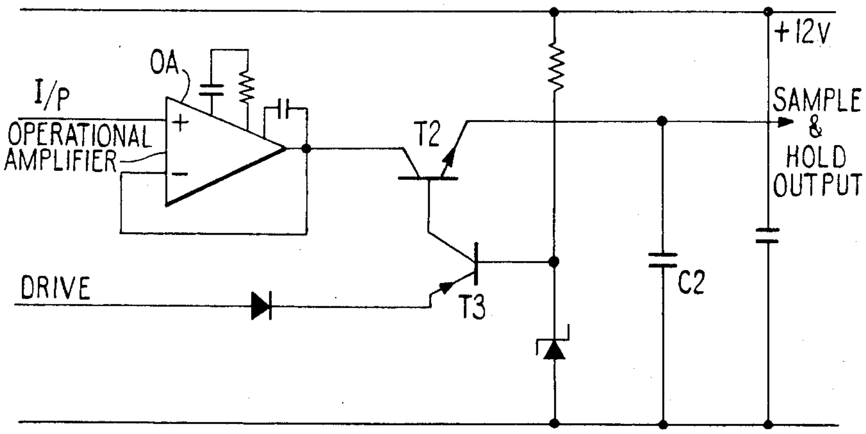

The sample and hold circuit, FIG. 5, samples the analog signal applied to the input I/P in response to a timing pulse on the drive input, in one microsecond, and holds that value for the remaining 19 microseconds of the sampling period. The analog signal is fed via a unit gain operational amplifier OA (also a standard integrated circuit unit) to the collector of transistor T2. During the one microsecond sampling period defined by a timing pulse on the drive input, the analog signal charges capacitor C2 via transistor T2. Transistor T2 is switched on by the drive pulse via a further transistor T3. When the one microsecond drive pulse ends, T3 and T2 cut off to leave C2 charged to the amplitude of the analog signal. During the next sampling period, C2 charges up or down to the new level of the analog signal, again via transistor T2.

While we have described above the principles of our invention in connection with specific apparatus it is to be more clearly understood that this description is made only by way of example and not as a limitation to the scope of our invention as set forth in the objects thereof and in the accompanying claims.

We claim:

1. An analog to digital converter comprising:

a first source of reference signal in the form of a ramp waveform starting at a given negative potential and increasing to a given positive potential through ground potential;

a second source of input analog signal;

a first amplitude comparator coupled to said first and second sources providing a first output signal when the amplitude of said analog signal and the amplitude of said reference signal are equal;

a second amplitude comparator coupled to said first source and said ground potential providing a second output signal when the amplitude of said reference signal equals said ground potential;

first means coupled to said first and second comparators responsive to said first and second output signals to provide a first digital output signal representative of the amplitude difference between said ground potential and the amplitude of said analog signal;

second means coupled to said first and second comparators responsive to said first and second output signals to provide a second digital output signal indicating the polarity of said analog signal; and third means coupled to said first and second means to combine said first and second digital output signals and thereby provide a digital output signal for said converter;

said first means including
digital counting means;

said counting means including a first digital counter coupled to said first comparator, the counting of said first counter being stated at the start of said ramp waveform and stopped in response to said first output signal, a second digital counter coupled to said second comparator, the counting of said second counter being started at the start of said ramp waveform and stopped in response to said second output signal, and fourth means coupled to said first and second counters to subtract the count of the first of said first and second counters to stop counting from the count of the second of said first and second counters to stop counting to produce said first digital output signal.

2. A converter according to claim 1, wherein said fourth means includes a digital complementer coupled to said first of said first and second counters to stop counting, and a digital adder coupled to said complementer and said second of said first and second counters to stop counting, said adder adding the complemented count at the output of said complementer to the true count at the output of said second of said first and second counters to stop counting to produce said first digital output signal.

3. An analog to digital converter comprising:

a first source of reference signal in the form of a ramp waveform starting at a given negative potential and increasing to a given positive potential through ground potential;

a second source of input analog signal;

a first amplitude comparator coupled to said first and second sources providing a first output signal when the amplitude of said analog signal and the amplitude of said reference signal are equal;

a second amplitude comparator coupled to said first source and said ground potential providing a second output signal when the amplitude of said reference signal equals said ground potential;

first means coupled to said first and second comparators responsive to said first and second output signals to provide a first digital output signal representative of the amplitude difference between said ground potential and the amplitude of said analog signal;

second means coupled to said first and second comparators responsive to said first and second output signals to provide a second digital output signal indicating the polarity of said analog signal; and third means coupled to said first and second means to combine said first and second digital output signals and thereby provide a digital output signal for said converter;

said first means including
digital counting means;

said counting means including third means coupled to said first and second comparators responsive to the first of said first and second input signals produced to produce a third output signal and to the second of said first and second output signals produced to produce a fourth output signal, a first digital counter coupled to said third means, the counting of said first counter being started at the start of said ramp waveform and stopped in response to said third output signal, a digital complementer coupled to said first counter, a second digital counter coupled to said third means, the counting of said second counter being started at the start of said ramp waveform and stopped in response to said fourth output signal; and a digital adder coupled to said complementer and said second digital counter to produce said first digital output signal.

4. A converter according to claim 3,wherein said third means includes a plurality of bistable stages coupled to said adder and said second means, the number of said stages being equal to the number of digital bits of the counts being added together in said adder plus the number of digital bits of said second digital output signal.

5. A converter according to claim 4, wherein the number of digital bits of said second digital output signal equals one.

* * * * *